(12) United States Patent
LaComb

(10) Patent No.: US 6,256,330 B1
(45) Date of Patent: Jul. 3, 2001

(54) GAIN AND INDEX TAILORED SINGLE MODE SEMICONDUCTOR LASER

(76) Inventor: Ronald Bruce LaComb, 67 Prospect Ave., Apt. #2, N.Kingstown, RI (US) 02852

( * ) Notice: Subject to any disclaimer, the term of this patent is extended or adjusted under 35 U.S.C. 154(b) by 0 days.

(21) Appl. No.: 08/980,934

(22) Filed: Dec. 1, 1997

Related U.S. Application Data

(60) Provisional application No. 60/032,187, filed on Dec. 2, 1996.

(51) Int. Cl.$^7$ .................................................... H01S 5/22
(52) U.S. Cl. ................................................ 372/46; 372/45
(58) Field of Search ................................ 372/45, 46, 29, 372/50, 96; 357/17

(56) References Cited

U.S. PATENT DOCUMENTS 5,994,723 * 11/1999 Sekii et al. .............................. 372/46

OTHER PUBLICATIONS

"Controlling The Mode Composition Of High–Power Buried InGaAsP/GaAs Lasers With a Wavelength of 0.8 $\mu$m.", by D.Z. Garbuzov, M.L. Boroditskil, N.D. LL'inskaya, D.A. Livshitz, D.N. Mar'inskil, and E.U. Rafailov, *Semiconductors* 28 (2), (Feb. 1994).

"Carrier Transport in Double–Heterostructure Active Layers", by W.B. Joyce, *J. Appl. Phys.* 53(11), (Nov. 1982).

"Astigmatism in Ridge–Stripe InGaAlP Laser Diodes", by Koichi Nitta, Kazuhiko Itaya, Masayuki Ishikawa, Yukio Watanabe, Gen–ichi Hatakoshi and Yutaka Uematsu, published Oct. 12, 1989.

"Improvement of high reliability inverted rib–waveguid lasers by the observation of degradation mechanisms", A. Rosiewicz et al., *IEEE Proceedings*, vol. 132, Pt. J., No. 6, pp. 319–324 (12/85).

Very High–Power (425–mW) AlGaAs SQW–GRINSCH Ridge Laser with Frequency–Doubled Output (41 mW at 428 nm), by H. Jaeckel, et al., *IEEE Journal of Quantum Electronics*, vol. 27, No. 6, pp. 1560–1567 (6/91).

"The Effect of Device Geometry on Lateral Mode Content of Stripe Geometry Lasers", by J.B. Delaney et al., *IEEE Journal of Quantum Electronics*, vol. QE–15, No. 8, pp. 750–755 (8/79).

(List continued on next page.)

*Primary Examiner*—James W. Davie
(74) *Attorney, Agent, or Firm*—McCormick, Paulding & Huber LLP

(57) ABSTRACT

An index guided semiconductor laser possessing both index tailoring and gain tailoring is provided. Modern semiconductor lasers are fabricated utilizing a suitable material system (such as GaAs—AlGaAs or InP—InGaAsP) heterostructures are formed by crystal growth technologies such as MOCVD to create an active layer providing carrier and optical confinement, a lateral waveguide created by a ridge waveguide and a Fabry-Perot cavity formed from cleaved facets. The semiconductor lasers are configured in diode fashion with p-type and n-type regions between contacts creating current path. Lateral optical confinement is accomplished by a ridge type waveguide formed either by regrowth or etching techniques, designed to possess an index step and index width conducive to supporting two modes (hence index tailored). Lateral gain confinement confining the current density to a thin layer centered in the ridge waveguide. Gain tailoring is employed to offset the confinement factors of the two supported modes, selecting the fundamental mode (hence gain tailoring) creating a wide fundamental mode device capable of high power operation. Current confinement can be accomplished through selective doping of a p-type material in the n-type layers making up the waveguide, or by etching grooves in the material hindering current diffusion or any other current diffusion limiting technique.

74 Claims, 8 Drawing Sheets

OTHER PUBLICATIONS

"Lateral carrier diffusion and surface recombination in InGaAs/AlGaAs quantum–well ridge–waveguide lasers", by S.Y. Hu et al., *J. Appl. Phys.*, vol. 76, No. 8, pp. 4479–4487 (Oct. 15, 1994).

"Spectral dependence of the change in refractive index due to carrier injection in GaAs lasers", by C.H. Henry et al., *J. Appl. Phys.*, vol. 52, No. 7, pp. 4457–4461 (7/81).

"Asymmetric Cladding–Ridge Waveguide Laser by Selective–Area MOCVD", by G.M. Smith et al., *IEEE Photonics Technology Letters*, vol. 7, No. 11, pp. 1255–1257 (11/95).

"Threshold characteristics of multimode laser oscillators", by L.W. Casperson, *Journal of Applied Physics*, vol. 46, No. 12, pp. 5194–5201 (12/75).

"Transverse Mode Stabilized $Al_xGa_{1-x}As$ Injection Lasers with Channeled–Substrate–Planar Structure", by K. Aiki et al., *IEEE Journal of Quantum Electronics*, vol. QE–14, No. 2, pp. 89–94 (2/78).

"Calculation of the effective refractive–index step for the metal–cladded–ridge–waveguide laser", by M.C. Amann et al., *Applied Optics*, vol. 20, No. 8, pp. 1483–1486 (Apr. 15, 1981).

"Iterative Calculation of Complex Propagation Constants of Modes in Multilayer Planar Waveguides", by C.A. Hulse et al., *IEEE Journal of Quantum Electronics*, vol. 28, No. 12, pp. 2682–2684 (12/92).

"Ridge waveguide AlGaAs/GaAs distributed feedback lasers with multiple quantum well structure", by S. Noda et al., *Appl. Phys. Lett.*, vol. 48, No. 26, pp. 1767–1769 (Jun. 30, 1986).

\* cited by examiner

GAIN AND INDEX TAILORED SINGLE MODE SEMICONDUCTOR LASER

This application claim benefit to provisional application 60/032,187 Dec. 2, 1996.

BACKGROUND OF THE PRESENT INVENTION

1. Field of Invention

This invention relates to semiconductor index guided lasers.

2. Description of Prior Art

Single-mode index guided semiconductor lasers are known to be useful devices providing excellent beam quality and kink-free optical power vs current performance. Index guiding refers to the creation of an optical waveguide by varying the optical index of refraction between semiconductor material layers (perpendicular direction) or by varying the index of refraction via other techniques such as by the formation of a ridge or buried heterostructure forming a waveguide in the lateral direction.. Waveguides created in this way establish stable optical modes which can be incorporated in a laser structure to improve beam quality and stabilize outputs. Low divergent ridge waveguide (RWG) semiconductor lasers possessing excellent beam quality and kink-free output optical power vs input electrical current (P-I) characteristics are realized by designing the RWG to support a fundamental lateral mode. The ridges are usually formed by etching a channel into the semiconductor to depth approaching the active layer, the modal characteristics of the ridge is determined by its width and depth. This limits the width of the ridge to approximately 3–4 microns for GaAs based devices supporting a single lateral mode. Due to material limitations this limits the maximum output power, limited by the intra-cavity peak intensity. Optical densities exceeding this limit causes the material at the facets to degrade leading to catastrophic optical damage COD, destroying the laser. To increase the single-mode output power for a given intra-cavity peak intensity the fundamental mode volume is increased. Researchers have widened the optical mode in the perpendicular direction by creating broadened waveguides (perpendicular to the epitaxial layers) but are limited in width by the onset of higher order modes. Multi-mode operation is undesirable for beam quality is deteriorated and P-I performance becomes kinky.

Reliable single-mode continuous wave (cw) operation of semiconductor-diode lasers has been achieved up to powers of 100 mW, although they are readily available commercially The power limitation of these devices arises form laser facet breakdown resulting in Catastrophic Optical Damage (C.O.D). High optical powers emanating from a very small surface area push the power density at the facet to power densities exceeding the intra-cavity-power density determined by the material damage limit. Localized heating at the facets is caused by non-radiative recombination at the facet of injected carriers and absorption of photons at the facet. These effects can cause ablation of the material from the facet, facet melting and the generation of other destructive mechanisms, resulting in C.O.D.. In addition the gaussian like intensity profile of the fundamental mode causes an intensity peak in the center generating a localized hot spot which reaches the critical limit first.

Research has been conducted to try to increase the optical modal volume of index guided lasers. One approach for increasing the single mode cross section is to taper the waveguide in the vicinity of the facet (thus spreading out the optical mode). Single element semiconductor lasers tapered to 7 $\mu$m at the facet were demonstrated at 600 mW. One problem with this design is that in addition to the waveguide being widened, the gain region is also widened. Thus the structure must be properly designed to filter out higher order modes.

The general belief of the semiconductor-laser community is that even with significant improvements in diode-laser lifetimes and increases in catastrophic facet-damage limits as well as improvements in thermal management, maximum single element diode laser output powers are limited to less than 1W in a single mode under cw operation. The limiting factor becomes the modal cross section, limited to approximately 4 $\mu m^2$, for conventional single element index guided GaAs based semiconductor lasers and power densities predicted to peak at approximately 20 $MW/cm^2$ resulting in a theoretical limit of 0.8 Watts.

This belief has lead researchers to approach the development of high power single mode coherent operation lasers by alternative techniques. One technique to achieve high power and single mode operation is provided by laser arrays. In these designs multiple ridges are etched in close proximity to increase the laser output. Laser arrays can reach power output as high as 20 Watts. The fundamental problem with laser arrays is that their structure is much more complex and their fabrication that more complicated compared to single element semiconductor lasers. In addition their beam quality is poor compared to single-element single mode semiconductor lasers. It has been shown that in-phase evanescent-mode arrays are fundamentally unstable. Laser diode arrays support many optical modes and it is the varying overlap of the gain with the optical modal patterns which is at the heart of the problem. Array lasers have far-field patterns with a maximum of 81% power in the central lobe of their respective far-field thus limiting useful power and the coupling to optical fibers. And larger sizes of arrays increase device complexity, yields, costs, and limit the pulse response thereby limiting amplitude modulation. Master Oscillator Power Amplifiers MOPA are another type of structure utilized to achieve high power single mode laser operation. These devices push the limits of both growth and processing techniques. They also require internal or external isolators and may require additional optics and suffer from beam stability as a function of drive current.

OBJECTS AND ADVANTAGES

As explained above, a successful technology to fabricate Fabry-Perot based semiconductor diode lasers operating in the single-mode with output cw powers in excess of 200 mW has not been established. Single-mode Fabry-Perot type semiconductor laser diode's output powers are limited by facet breakdown, (the modal intensity pattern exceeds the intra-cavity peak intensity at the facet). Fundamental mode operation limits the modal intensity width thus limiting the device's maximum output power, lasers supporting wider waveguides, which are be capable of higher output powers for a given intra-cavity peak intensity, also support many higher order modes deteriorating the optical quality of the laser output. Light output is limited by the gaussian shaped causing facet breakdown, since the material limitations cannot be changed one method of increasing the device's output power is to widen the modal intensity pattern. Thus, an object of this invention is to provide a device structure capable of supporting a wide fundamental mode in either the lateral and/or perpendicular direction allowing for high power operation in excess of 200 mW cw, theoretically, widening the mode in both the perpendicular and lateral direction a modal cross-section of over 24 $\mu m^2$ is achievable utilizing this invention, this single-modal cross-section could potentially emit output powers exceeding 4 Watts. In addition, index tailoring techniques are utilized to flatten the modal pattern creating a "top hat" shaped intensity profile in contrast to a guassian profile, which could support higher operating powers. In additon, the fabrication techniques required to realized these devices are very simple compared to the other techniques mentioned, making them potentialy less expensive in addition to being of superior performance.

SUMMARY OF THE INVENTION

Figure 1:
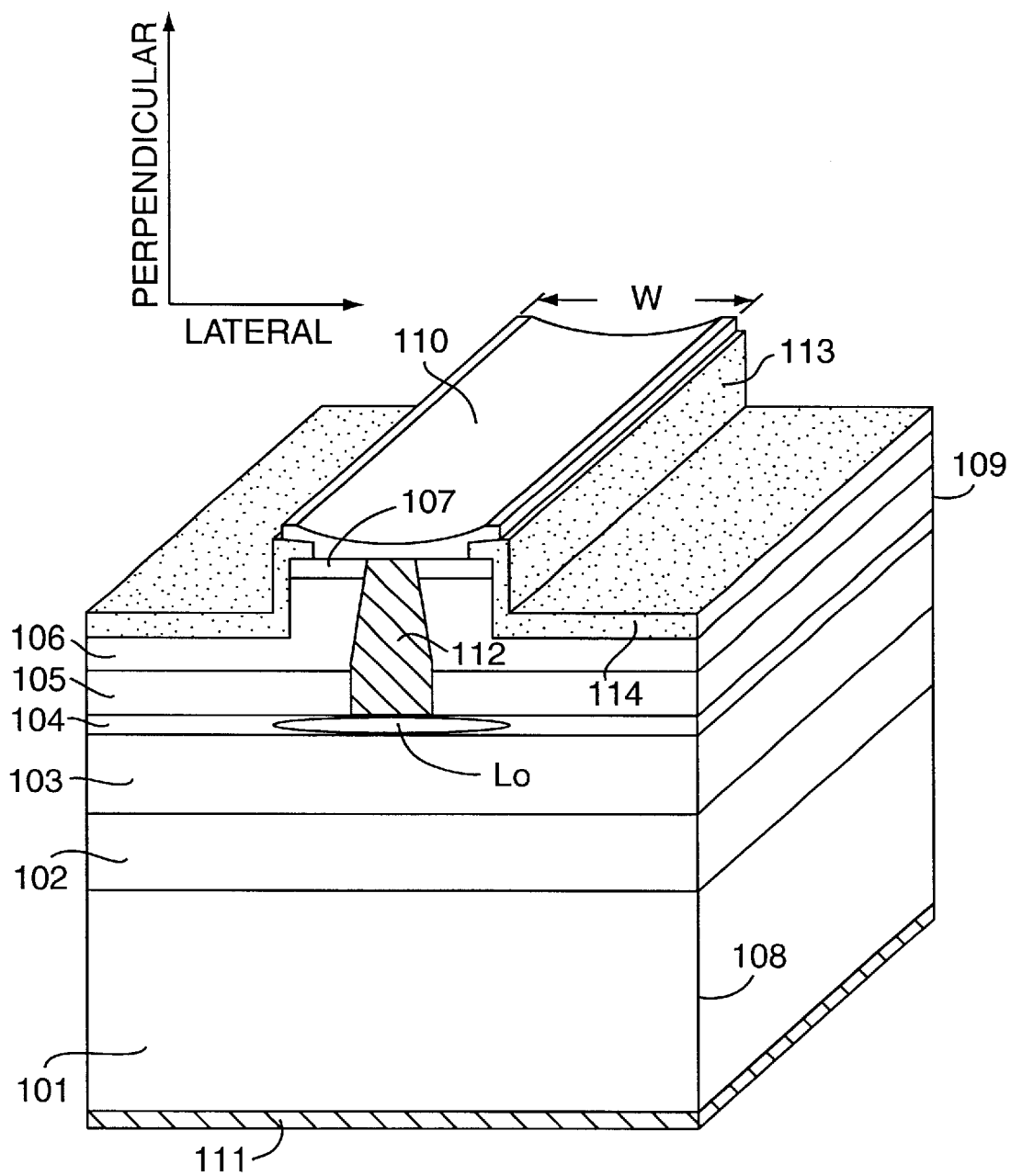
FIG. 1 shows a double heterostructure single quantum well RWG laser utilizing Zn diffusion to limit current diffusion according to the principles of this invention.

This invention provides a semiconductor laser structure which is index guided and capable of supporting a wide fundamental lateral mode (4–5 times wider than modern single mode index guided semiconductor laser structures) and/or a wide perpendicular mode increasing optical power limits and decreasing divergence. Accordingly, single lateral mode laser powers exceeding 1 Watt are possible.

Modern index guided single mode semiconductor laser wafers are fabricated using suitable materials including ($Al_xGa_{1-x}AsP, Al_xGa_{1-x}As, InGaAsP$) where x represents the mole fraction and ranges from zero to one, and other materials. For example $Al_xGa_{1-x}As$ is grown by metal organic vapor phase epitaxy MOCVD on a GaAs substrate varying the Al mole fraction and the doping (which makes the material electron (n-type) or hole(p-type) rich) to form the laser wafer structure. For example a simple double heterostructure laser structures can be realized by growing a n-type $Al_xGa_{1-x}As$ layer (cladding layer) on a GaAs (100 orientation), on top of which is grown a undoped GaAs active layer followed by a p-type AlGaAs layer followed by a $p^+$-type GaAs cap layer utilized to make contact to, an additional contact is placed on the underside of the n-substrate providing a current path. The active layer being higher in refractive index and lower in bandgap compared to the cladding layers (consisting of AlGaAs) provides perpendicular optical and carrier confinement. When current is passed through the device electrons and holes recombine in the active layer radiatively and under appropriate drive conditions lasing can take place provide an optical feedback loop exists. Optical feedback can be realized by cleaving the crystal at two ends forming a Fabry Perot etalon or by establishing a Bragg reflector capable of selecting a single frequency to amplify. Many different laser structures are realized making use of these simplified techniques, Broad area semiconductor laser structures utilize a more complex structure consisting of many epitaxial layers to create a laser structure which supports a wide perpendicular fundamental mode. Broad are laser structures have been shown to posses high optical powers and relatively low divergence both related to the wide perpendicular mode.

In accordance with the present invention, to achieve a wide single lateral mode, there is provided an index guided semiconductor laser having a lateral waveguide providing optical confinement and a current confining mechanism tailoring the gain to overlap with the fundamental lateral mode. Offsetting the modal gain of the fundamental mode over that of the supported higher order modes favors fundamental mode operation in a multi-mode waveguide. The lateral waveguide can be formed by standard technology including ridge waveguide structures and buried waveguide structures and other techniques. The current confinement is provided by ether etching grooves in the material or by dopant diffusion or other current confining techniques.

To achieve a wide perpendicular mode utilizing the principles of this invention, semiconductor layers are grown via MOCVD with specified thicknesses and index of refractions to form a waveguide supporting two perpendicular modes with the gain region/active layer centered in the structure favoring fundamental operation.

By increasing the modal cross-section the lasers output divergence is reduced being inversely proportional to the mode width and to the mode number and thus low divergence is also a characteristic of this invention.

Modern semiconductor index guided fundamental mode lasers utilize only the optical waveguide to select the lasing modes, contacting the entire width of the lateral waveguide in the lateral direction. Typical GaAs base index guided fundamental mode semiconductor lasers posses lateral mode widths limited to approximately 3–4 microns (limited by the onset of higher order modes). This limits the maximum output power, for critical optical power densities are reached causing catastrophic facet damage, limiting output power.

In one preferred embodiment, the semiconductor optical waveguide comprises MOCVD grown layers of AlGaAs/GaAs or other suitable materials in the appropriate mole fractions (Al percentage in the AlGaAs/GaAs case) including a cladding layer, an active layer and a top cladding layer stacked in the perpendicular direction. A ridge is etched in the lateral direction, with the bottom of the ridge in close proximity to the active layer. All the layers in this embodiment are grown n-type and a p-type region is defined utilizing Zn diffusion, the p-type region is confined to the center of the ridge. When electrodes are added to the top of the ridge and bottom of the structure current flows through the p-type material to the n-type material. The current is confined in the p-type region thus the optical gain is confined to the p-type region overlapping with the fundamental mode to a higher degree than other modes supported by the waveguide, thus favoring fundamental mode operation. This allows for the establishment of a wider fundamental mode device compared to conventional index guided lasers who's gain regions are equal to or wider than their respective modal profiles.

DESCRIPTION OF THE PREFERRED EMBODIMENTS

Operation of the First Embodiment

FIG. 1 shows a first embodiment in which a gain-tailored and index tailored structure utilizing Zn diffusion is applied to a GaAs/AlGaAs single quantum well semiconductor ridge-waveguide laser. On a n-type GaAs substrate 101 of the (100) plane orientation are grown the following layers: Bottom cladding layers consisting of one to several layers of higher bandgap and lower index of refraction than that of the active layer. A typical cladding 102 layer is, a n-type AlGaAs layer with typical doping of Si-5xe18, Al mole fraction on the order of 0.6 and thickness of 1 micron, followed by a n-type AlGaAs guiding layer 103 with typical doping of Si-1-5E17, Al concentration on the order of 0.3 and thickness of 1000 angstroms. This is followed by a single quantum well active layer 104 of AlGaAs with relatively low Al concentration or of GaAs, typically of the order of 100 angstroms. This is followed by a top guiding layer consisting an n-AlGaAs layer 105 with typical doping of Si 1-5E17, Al mole fraction of 0.3 and thickness of 1000 angstroms, followed by a top cladding n-AlGaAs layer 106 of typical concentration of Si-1E18, Al mole fraction 0.6 and thickness of 1 micron. This is followed by a nGaAs contact layer 107 consisting typically of n-type Si-3E17 and thickness of 0.25 microns. A ridge 113 is etched through the cap layer 107 into the top cladding layer 106. The surface of the wafer other than the top of the ridge is formed a $SiO_2$ film 114 of typical thickness of 2000 angstroms as a protector. On top of the ridge 110 and on the back side of the substrate 111 are formed electrodes consisting of TiPtAu and Au/GeNi.

The depth of the ridge and the width of the ridge W is designed to sustain multi-lateral mode operation (typically two lateral modes). To form the conducting path in a totally n-type structure Zn-doping 112 which is a p-type dopant in GaAs/AlGaAs is utilized. The Zn doped material provides a current path when a voltage is applied between the top contact 110 and the bottom contact 111. The Zn doping is confined to a thin layer centered under the ridge structure.

Method of Producing First Embodiment

Figure 2A:
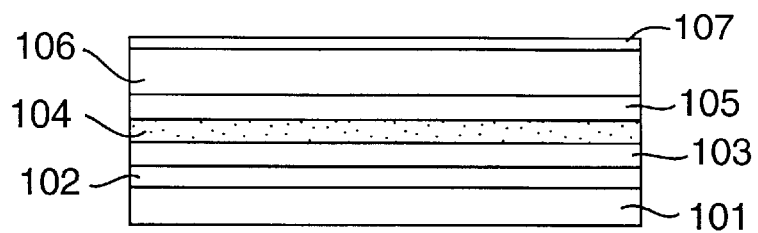
FIGS. 2a to 2g are a partial cross-section showing a production method of the gain and index tailored semiconductor laser shown in FIG. 1.

A method of producing the first embodiment is explained referring to FIGS. 2a–2g. First, an epitaxial design consisting of multiple semiconductor layers grown by the metal organic vapor phase epitaxy (MOVPE) method is implemented on a GaAs substrate. On the upper surface of the n-type GaAs substrate 101 of the (100) plane orientation, an n-type AlGaAs cladding layer 102 (doping typically 1E18 $cm^{-3}$) with typical Al mole fraction of 0.6 and typical thickness of about 1 $\mu$m is grown. This is followed by growing a lightly doped n-type (1E17 $cm^{-3}$) AlGaAs guiding layer 103 of typical thickness of 0.1 $\mu$m and typical Al mole fraction of 0.35, followed by a undoped GaAs single quantum well 104 intrinisicly doped with thickness of about 100 Å, followed by a top guiding layer 105 and top cladding layer 106 similar in composition and thickness to the bottom guiding 103 and cladding layers 102, followed by a n-type (typically 1E17 $cm^{-3}$) GaAs cap layer 107 typically 0.25 $\mu$m thick grown in this order (FIG. 2a).

Figure 2B:
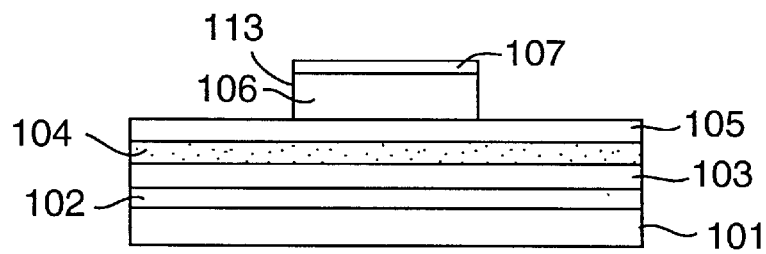
Figure 2C:
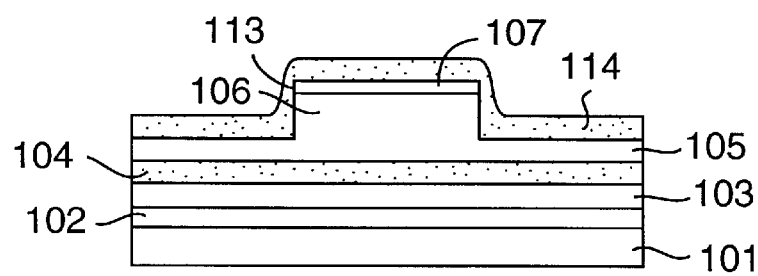

Subsequently, a ridge FIG. 2b 113 is etched toward the (011) direction ether by dry etching techniques or wet chemical etching techniques, forming ridged stripe of width (FIG. 1 W) typically 10–13 $\mu$m and to a depth resulting in the support of two lateral.

Figure 2D:
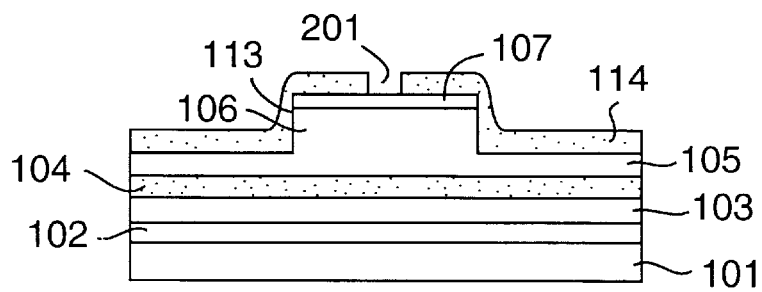

Following this a $SiO_2$ layer 114 typically 2000 Å thick is grown (FIG. 2c) which is then patterned by conventional photolithography techniques creating an opening 201 FIG. 2d centered on top of the waveguide running parallel to the ridge of width 1–3 $\mu$ms compared to the ridge width typically (10–12 $\mu$ms), which will be utilized as a mask for Zn diffusion.

Figure 2E:
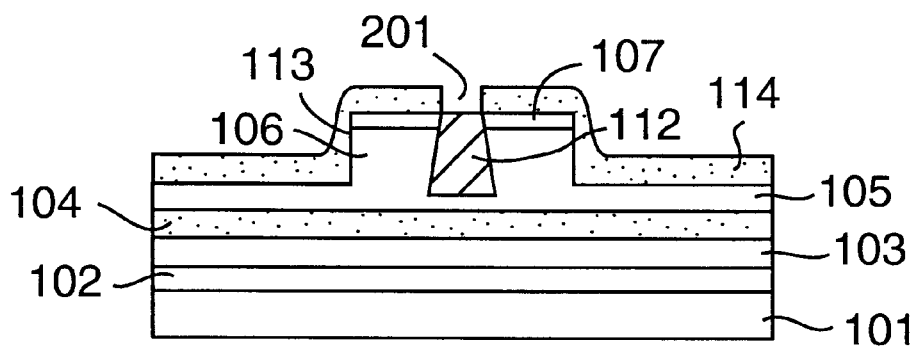

Next, Zn is diffused through the window 201 into the n-type layers utilizing closed ampoule techniques FIG. 2e. During Zn diffusion the $SiO_2$ blocks diffusion, allowing Zn to enter the material only at the opening in the $SiO_2$, limiting the width of the Zn diffusion. The time of diffusion is limited, allowing the Zn to diffuse to approximately the top guiding layer up to the active layer (FIG. 2e).

Figure 2F:
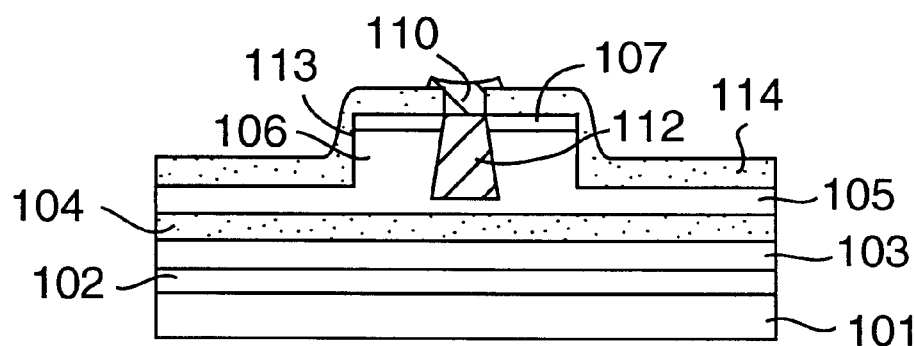

Next, the top electrode is formed 110 consisting of TiPtAu at the window 201 making contact with the p-type material (created by Zn diffusion) (FIG. 2f).

Figure 2G:
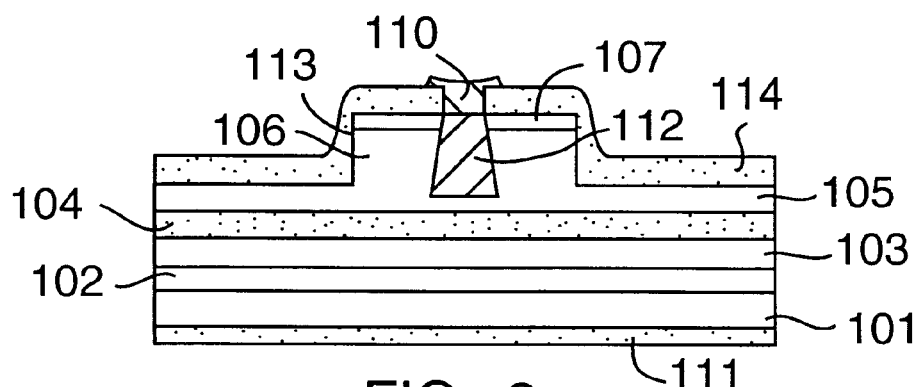

Then the lower surface of the n-type GaAs substrate is lapped and polished to a thickness of approximately 100 $\mu$m, then the n-side electrode 111 is formed consisting of AuGeNi FIG. 2g. Thereafter, a plurality of semiconductor lasers are individuality isolated by a cleavage method and a reflectivity coating is applied to the cleaved facets. Typical devices are approximately 500 $\mu$m×1000 $\mu$m consisting of one ridge. The devices are mounted ridge side down on a Cu-block coated with In (thus the Cu-Block is the cathode) and Au wires are attached to the n-side contact forming the anode of the device, thus finishing the production of the gain and index tailored ridge waveguide laser.

Operation of the First Embodiment

Figure 5:
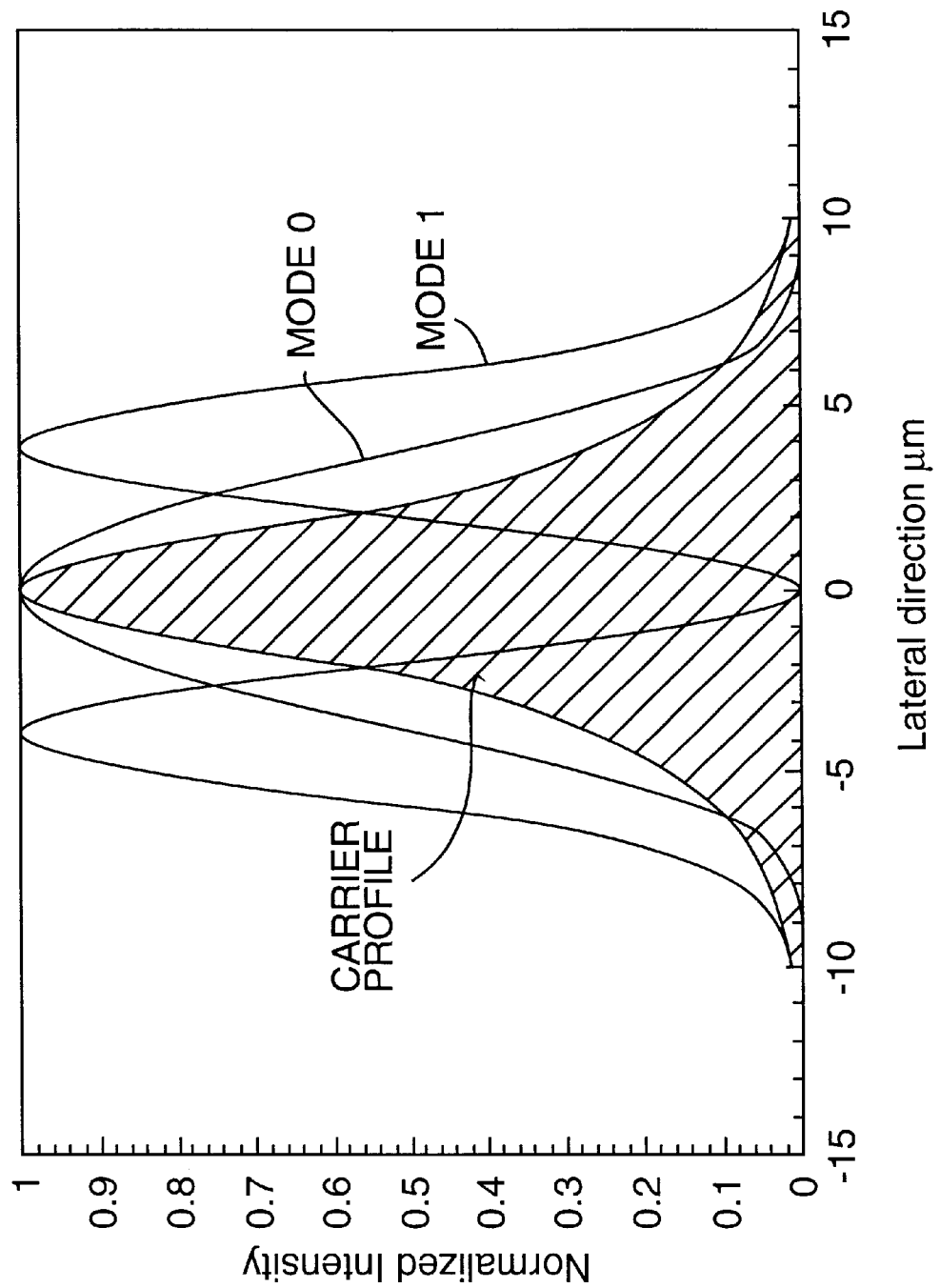
FIG. 5 is a graph showing the lateral modal intensity patterns and injected lateral carrier profile for a typical double heterostructure single quantum well RWG laser following the principles of this invention.

In FIG. 5 is shown the calculated lateral intensity patterns mode 0 referring to the fundamental mode and mode 1 referring to the next highest lateral mode confined by a 12 $\mu$m ridge-waveguide structure, following the principles of this invention. Also shown in the FIG. 5 is the calculated lateral carrier profile in the active layer for a Zn diffusion associated with a 3 micron width (201 FIG. 2e) at the surface of the cap layer 107. The Zn is diffused through the cap layer 107, through the first cladding 106 layer into layer 105. The optical gain of a semiconductor diode laser being directly related to the current density is confined to the Zn diffused region. By confining the gain region to a narrow strip centered in the lateral waveguide the modal gains associated with each mode can be offset favoring fundamental mode operation. It is seen (FIG. 5) that the carrier profile-mode intensity overlap is greater for mode 0 (fundamental mode) compared to mode 1. This establishes an overall lower loss for the fundamental mode 0 reducing its threshold for lasing compared to mode 1. Since at threshold of lasing, the carrier density is fixed (gain clamping) fundamental mode operation is favored throughout the current-power operation of the laser. Upon lasing, light exits through the front and back facets 108 & 109. A stable fundamental RWG laser can be realized utilizing this invention with a RWG design with a strong enough refractive index step to dominated over dynamic effects (index changes with temperature, index changes with gain for example). The realization of a wide fundamental lateral mode (up to 4–5 times wider than conventional single mode RWG laser structures allows for higher power operations. For lateral fundamental mode lasers are power limited by material limitations brought on by high optical power densities existing at the facets of the laser, for a given power density, the wider the mode the higher the potential output power.

Second Embodiment

Figure 3:
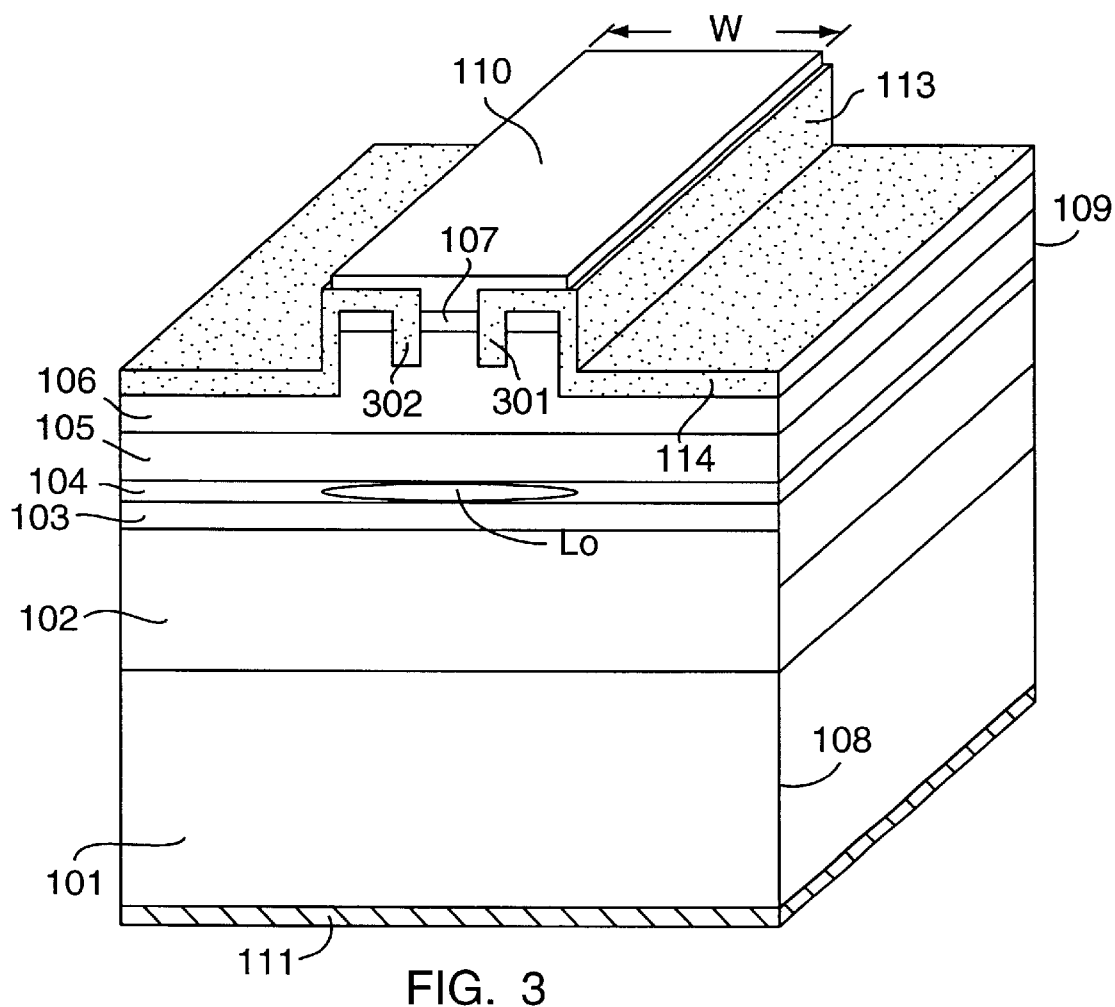
FIG. 3 shows a double hererostructure single quantum well RWG laser utilizing etched grooves to limit current diffusion according to the principles of this invention.

FIG. 3 is a perspective view of a GaAs/AlGaAs Gain and Index tailored RWG laser structure utilizing etched notches to provide current confinement and therefore gain tailoring. The basic structure for this description is identical to the first embodiment omitting the etched notches 301 and 302 and will not be repeated. The etched notches 301 and 302 are typically 1 μms wide and etched a little shallower than the ridge 113. $SiO_2$ 114 is grown following the ridge and notch etch, coating the surface of the semiconductor including the notches. A window is etched in the $SiO_2$ to allow for a p-contact 110 consisting of TiPtAu thus contacting only a small portion of the cap layer 107 centered in between the two notches. The narrow contact and etched notches limit the current density to the center of the ridge overlapping with the fundamental lateral mode more than that of high order modes. With proper design of the ridge width an depth (designed to confine two lateral modes), the groove depth an separation (designed to block current diffusion with out modifying the optical waveguide significantly) a wide single lateral mode laser structure is possible.

Method of Producing the Second Embodiment

The method of producing the second embodiment follows that of the first embodiment with the following changes: Following the ridge etch illustrated in FIG. 2b the two notches are etched in the same fashion as the ridge, illustrated in FIG. 3 as 301 and 302. Also, the Zn diffusion illustrated in FIG. 2e 112 would not be present (the notches providing the current confinement in the lateral direction).

Operation of the Second Embodiment

The operation of the second embodyment is identical to the first embodiment except the notches in the second embodiment provide the lateral current confinement instead of a Zn diffusion.

Third Embodiment

Figure 4:
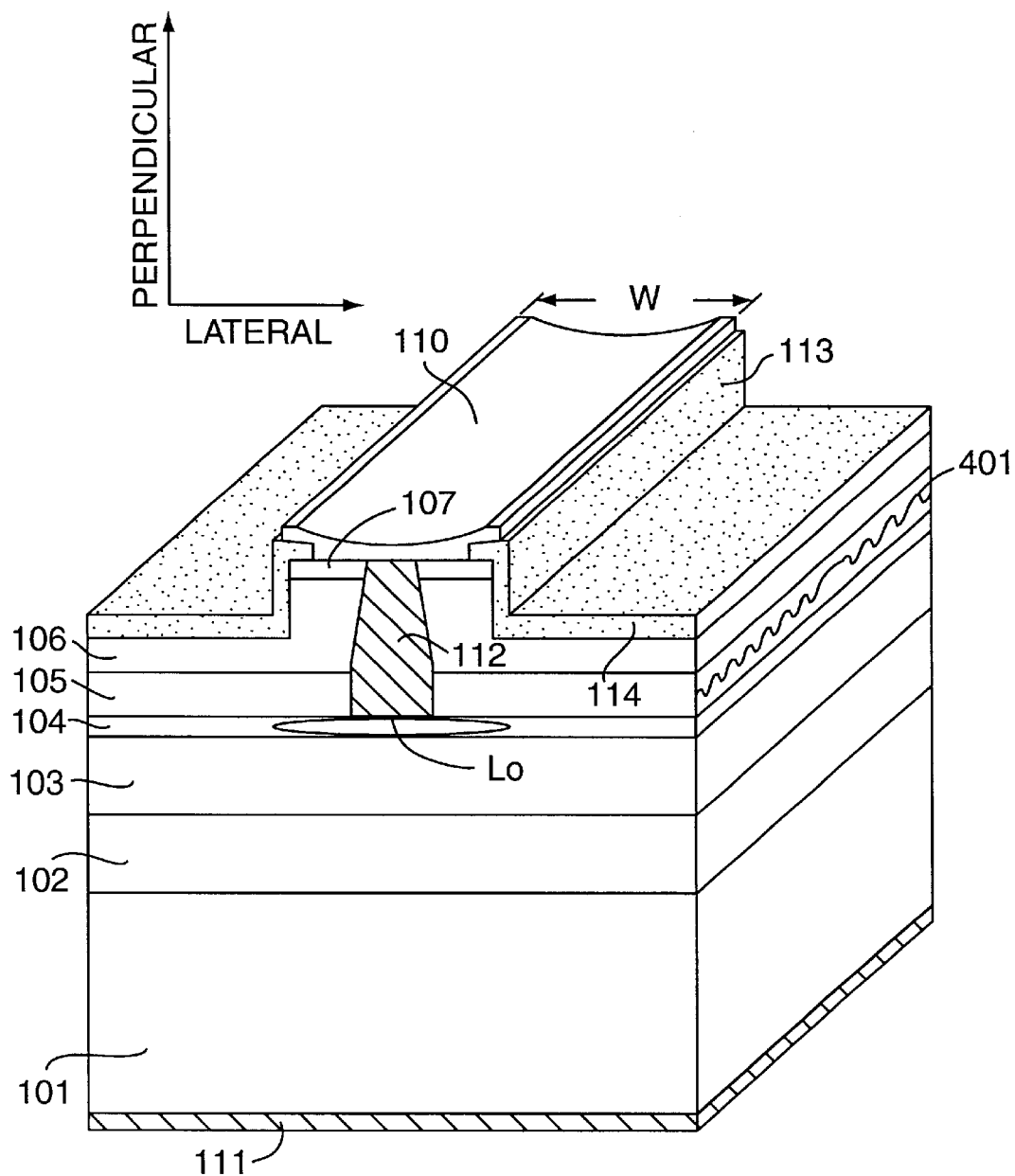
FIG. 4 shows a double hererstructrue single quantum well RWG distrubuted feed back DFB laser utilizing Zn diffusion to limit current diffusion according to the principles of this invention.

FIG. 4 is a perspective view of a Distributed Feedback (DFB) GaAs/AlGaAs Gain and Index tailored RWG laser structure utilizing Zn diffusion and a single quantum well following the principles of this invention. The structure is identical the structure illustrated in FIG. 1 except the facets 108 and 109 are replaced with a Bragg reflector 401 providing the optical feedback mechanism. This design has the advantage of single frequency operation associated with standard DFB laser characteristics and illustrates the integration of the GIT RWG laser structure with a DFB laser. The DFB laser design could also be incorporated with the device detailed in the second embodiment.

Method of Producing the Third Embodiment

The method of producing the third body is equal to those illustrated in the first embodyment with the inclusion of the DFB structure. The DFB structure is realized following conventional DFB fabrication techniques.

Fourth Embodiment

Figure 6:
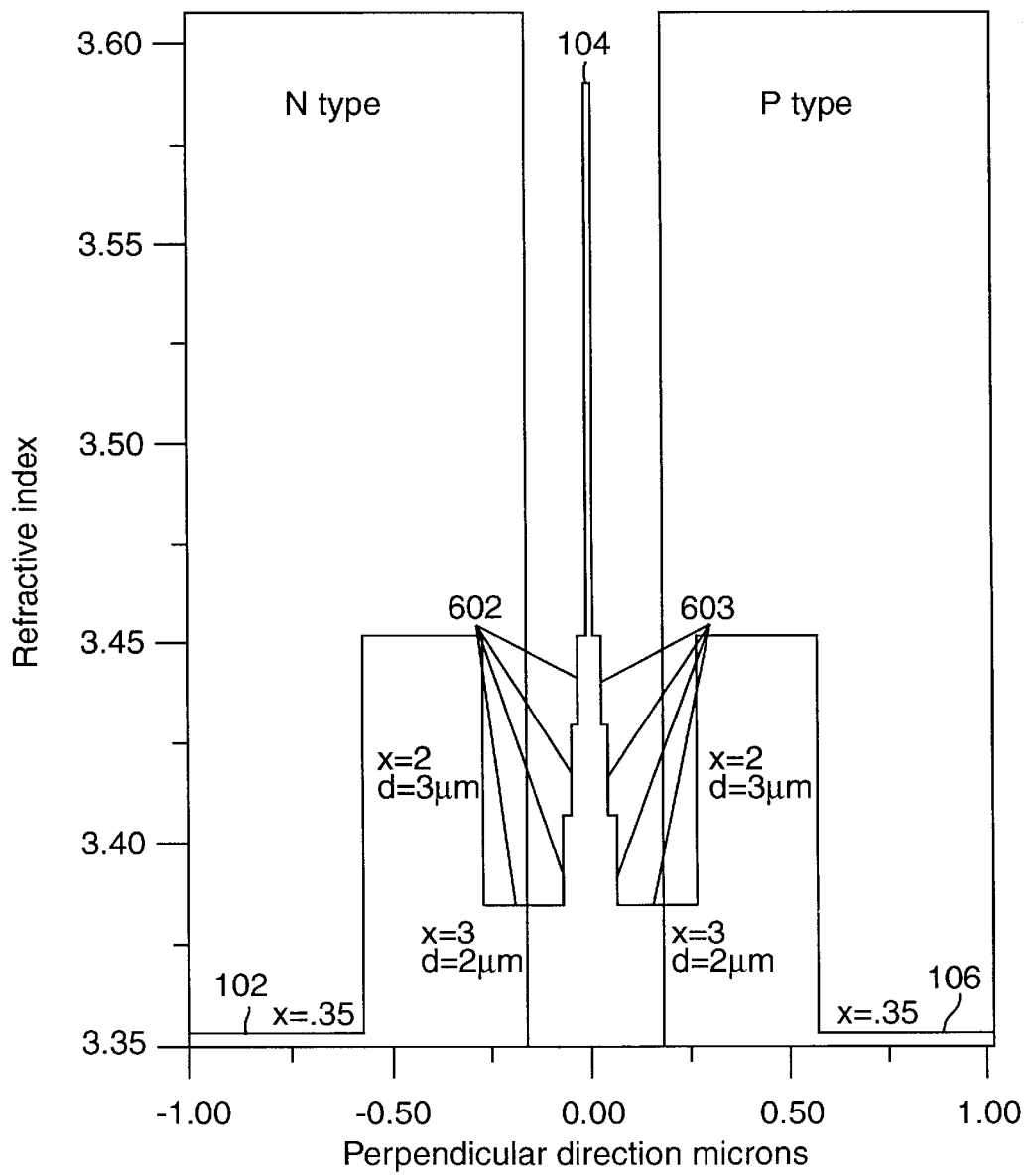
FIG. 6 is a graph of the index of refraction as a function of perpendicular direction formed by MOCVD growth for a GaAs/AlGaAs based laser structure, a typical structure to implement the principles of this invention in the perpendicular direction, and to also flatten the fundamental mode intensity pattern.

FIG. 6 shows the index of refraction for a series of MOCVD grown GaAs/AlGaAs layers grown on top of a n-GaAs substrated as a function of perpendicular direction for a typical structure designed to support a wide perpendicular mode. The GaAs based epitaxial design incorporates the principles of said invention in the perpendicular direction. The guiding layers 602 and 603 are modified from the single layers 103 and 105 of FIG. 1, to support two perpendicular modes and to tailor the mode's intensity profile from a near guassian distribution to a top-hat like distribution. The guiding layers 602 and 603 in this example consist of several layers (typical thicknesses d and Al mole fractions x are listed in FIG. 6) with varying Al mole fraction designed to tailor the perpendicular mode on ether side of a undoped GaAs single quantum well 104 intrinsically doped with thickness of about 100 Å. This epitaxial design is utilized in conjunction with the embodiments previously discussed to realize a Fabry-Perot semiconductor laser device.

Operation of the Fourth Embodiment

Figure 7:
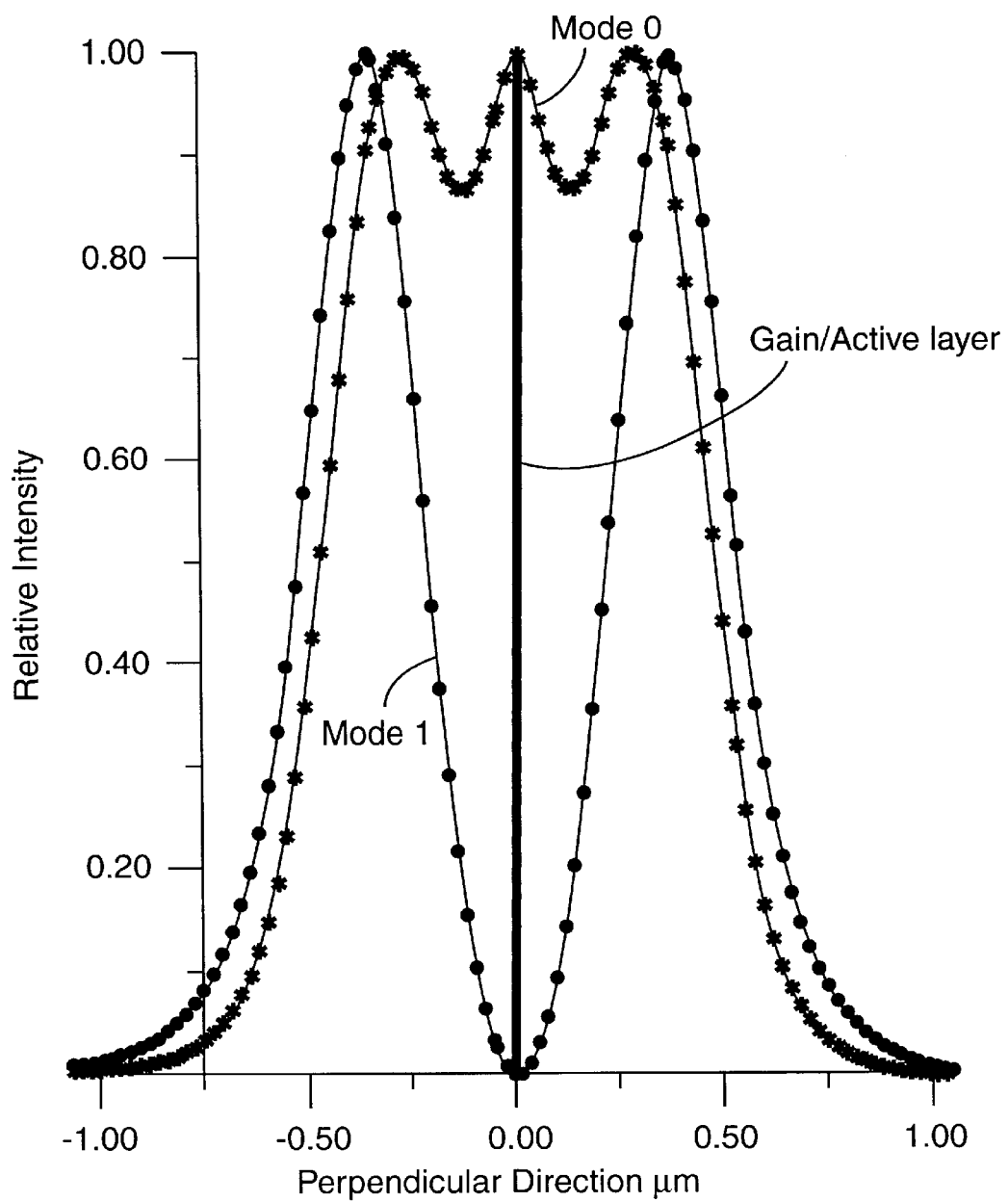
FIG. 7 is a graph of the perpendicular modal patterns associated with the structure shown in FIG. 6.

FIG. 7 shows the calculated perpendicular intensity patterns mode 0 and mode 1 for the two supported perpendicular modes of a typical epitaxial design following this invention. Also shown in the figure is the perpendicular gain region defined by the active layer Gain/Active layer, the gain region is seen to overlap strongly with the fundamental mode mode 0, and very weakly with the higher order mode mode 1, thus favoring perpendicular fundamental mode operation. In this embodiment the optical mode in the perpendicular direction is tailored to be wide and "top-hat" shaped allowing for a wide perpendicular fundamental mode. The waveguiding layers 601 and 602 and the cladding layers 102 and 106 are designed to support two perpendicular modes with the fundamental mode's intensity pattern being flattened out. This epitaxial design can be utilized to create a Fabry-Perot semiconductor laser similarly to the before mentioned embodiments. This embodiment incorporated with a wide lateral mode semiconductor laser (described in the first three embodiments) allows for a ultra-wide single mode cross section further increasing potential laser output powers.

Method of Producing the Fourth Embodiment

The method of producing the fourth embodiment follows that of the first embodiment with the following changes. The epitaxial design is altered to include the modified waveguiding layers 601 and 602, and the cladding layers 102 and 106 are altered (by redesigning their thicknesses and Al mole fractions) to form a waveguide in conjunction with the active layer 104 and the waveguiding layers 601 and 602 to support two perpendicular modes. Utilizing this modified wafer structure in conjunction with the previously mentioned techniques listed in the first three embodiments or other semiconductor laser structures allows for the realization of a high power single mode laser.

SUMMARY

Thus the reader will see that a high power (>200 mW) single lateral and perpendicular mode index guided semiconductor laser is realizable following the principles of this invention. While the above description contains several preferred embodiments these should not be construed as the only embodiments applicable to the principles of this invention, but rather as an exemplification of several perferred embodiments. Many other embodiments are possible, for example, lateral current confinement could be achieved via proton bombardment in conjunction with a ridge waveguide, or lateral optical confinement could be achieved utilizing a buried heterostructure. Accordingly, the scope of the invention should be not be based solely on the embodiments illustrated but by the appended claims and their legal equivalents.

What is claimed is:

1. A semiconductor laser apparatus, comprising:
   an optical waveguide for providing optical confinement in lateral and perpendicular directions, said optical waveguide including an active layer stacked in the perpendicular direction between first and second layers, said first layer including a dopant of one of n-type and p-type and said second layer including gain confining region doped the other of n-type and p-type and extending in the perpendicular direction, said optical waveguide capable of supporting one of a plurality of perpendicular modes and a plurality of lateral modes;

contacts for providing current for the active layer; and wherein said gain confining region has a geometry which is substantially matched to an intensity profile of a selected one of said mode plurality, thereby providing a modal gain difference between the selected mode and the remainder of said mode plurality.

2. The semiconductor laser apparatus of claim 1 including cleaved facets for providing fabret perot operation of the laser apparatus.

3. The semiconductor laser apparatus of claim 1 including Bragg reflectors such that said laser apparatus operates as one of a Distributed Feedback Laser and a Distributed Bragg Reflector Laser.

4. The semiconductor laser apparatus of claim 1 wherein said gain confining region has a width in the lateral direction that is less than the width in the lateral direction to which said lateral modes supported by said optical waveguide extend.

5. The semiconductor laser apparatus of claim 1 wherein said optical waveguide includes a ridge waveguide structure.

6. The semiconductor laser apparatus of claim 5 wherein said gain confining region is under and substantially centered relative to said ridge waveguide structure.

7. The semiconductor laser apparatus of claim 5 wherein said ridge waveguide structure has a selected width in the lateral direction and wherein said gain confining region has a width in the lateral direction that is less than said selected width.

8. The semiconductor laser apparatus of claim 1 wherein said optical waveguide includes a buried waveguide structure.

9. The semiconductor laser apparatus of claim 8 wherein said gain confining region is centered in the lateral direction about said buried waveguide structure.

10. The semiconductor laser apparatus of claim 8 wherein said buried waveguide structure has a selected width in the lateral direction, and wherein said gain confining region has a width in the lateral direction that is less than said selected width.

11. The semiconductor laser apparatus of claim 1 including a pair of insulating notches extending in the perpendicular direction and spaced in the lateral direction for defining the gain confining region therebetween.

12. The semiconductor laser apparatus of claim 1 wherein said first and second layers both include n-type dopants.

13. The semiconductor laser apparatus of claim 1 wherein said second layer includes a region including a dopant of the same type of said dopant that said first layer includes, and wherein said optical waveguide includes a buried waveguide structure.

14. The semiconductor laser apparatus of claim 1 wherein said second layer includes a region including a dopant of the same type of said dopant that said first layer includes, and wherein said optical waveguide includes a ridge waveguide structure.

15. The semiconductor laser apparatus of claim 12 wherein said gain confining region of said second layer includes a Zn dopant.

16. The semiconductor laser apparatus of claim 1 including proton bombarded regions extending in the perpendicular direction and spaced in the lateral direction for defining the gain confining region therebetween.

17. The semiconductor laser apparatus of claim 1 wherein said gain confining region is a region of a layer that includes a proton bombarded region.

18. The semiconductor laser apparatus of claim 1 wherein said mode whose excitation is favored is a fundamental mode of operation of the laser apparatus.

19. The semiconductor laser apparatus of claim 1 wherein the index of refraction of said semiconductor laser, as a function of perpendicular distance from the active layer, is lower than the index of refraction of said active layer within a first distance of said active layer and wherein between said first distance and a second distance greater than the first distance is the index of refraction is less than that of the active layer and greater than the index of refraction within first distance.

20. The semiconductor laser apparatus of claim 1 wherein, as a function of perpendicular distance from said active layer, the index of refraction of the semiconductor laser decreases from the index of refraction of the active layer in a series of steps, each successive step having a lower index of refraction than the preceding step, and then increases for a subsequent step, the index of refraction of the subsequent step being lower than that of the active layer.

21. The semiconductor laser apparatus of claim 20 wherein said subsequent step has an index of refraction substantially equal to that of a previous step in said series of steps.

22. A semiconductor laser apparatus, comprising:

an active layer;

index guiding means including at least first and second layers disposed about said active layer, said index guiding means for providing optical confinement in the perpendicular and lateral directions for supporting at least one of a plurality of lateral modes and a plurality of perpendicular modes;

means for providing carriers for radiative recombination in said active layer; and means for confining the optical gain in a region having a geometry which is substantially matched to an intensity profile of a selected one of said mode plurality, thereby providing a modal gain difference between the selected mode and the remainder of said mode plurality.

23. The semiconductor laser apparatus of claim 22 wherein said means for confining the optical gain includes means for providing lateral confinement of the carriers.

24. The semiconductor laser apparatus of claim 23 wherein said means for providing lateral confinement of the carriers includes a layer having a first region doped one of n-type and p-type and a second region doped the other of n-type and p-type.

25. The semiconductor laser apparatus of claim 23 wherein said means for providing lateral confinement includes a Zn-doped region.

26. The semiconductor laser apparatus of claim 23 wherein said means for providing lateral confinement includes a region doped one of n-type and p-type and extending in the perpendicular direction and having a width, in the lateral direction, that is less than the width in the lateral direction to which said supported lateral modes extend.

27. The semiconductor laser apparatus of claim 23 wherein said means for providing lateral confinement includes a pair of insulating regions extending in the perpendicular direction for confining the optical gain between said pair.

28. The semiconductor laser apparatus of claim 23 wherein said pair of regions includes a pair of ridges extending in the perpendicular direction towards said active layer.

29. The semiconductor laser apparatus of claim 23 wherein said means for providing lateral confinement includes a layer including a doped region and a proton bombarded region.

30. The semiconductor laser apparatus of claim 23 including one of Bragg reflectors and a distributed feedback structure for operating said semiconductor laser apparatus in a single longitudinal mode.

31. The semiconductor laser apparatus of claim 23 wherein, as a function of perpendicular distance from said active layer, the index of refraction of said index guiding means is tailored for flattening the mode intensity pattern of a selected mode.

32. An index guided semiconductor laser for providing laser light in the longitudinal direction, comprising:
an active layer stacked in the perpendicular direction with index guiding doped layers that provide optical confinement in the lateral and perpendicular directions such that the semiconductor laser can support at least one of a plurality of lateral modes and a plurality of perpendicular modes;
a pair of contacts for injecting current to the active region for exciting the laser, and wherein
said index guided laser apparatus further including a first doped region extending in the perpendicular direction and to which carriers are confined in the lateral direction such that the optical gain of the laser apparatus substantially matched to a selected mode of one of the plurality of modes more than at least one other mode of the plurality for providing a modal gain difference between the selected mode and the at least one other mode for favoring excitation of the selected mode.

33. The semiconductor laser apparatus of claim 32 wherein said first doped region includes Zn doping.

34. The semiconductor laser apparatus of claim 32 wherein said first doped region is a p-doped region, and the p-doped region is disposed between, in the lateral direction, n-doped regions.

35. The semiconductor laser apparatus of claim 32 wherein said first doped region is a region of a layer that includes a proton-bombarded region.

36. The semiconductor laser apparatus of claim 32 wherein said first doped region is disposed between a pair of insulating ridges extending in the perpendicular direction.

37. The semiconductor laser apparatus of claim 32 wherein said first doped region has a width in the lateral direction that is less than the width in the lateral direction to which said lateral modes extend.

38. A method of providing laser light, comprising the steps of
providing an active material;
providing optical feedback to the active material in the longitudinal direction;
optically confining the laser in the lateral and perpendicular directions such that the laser can support at least one of a plurality of lateral modes and a plurality of perpendicular modes;
producing optical gain in the active material; and
confining the optical gain to a region that substantially matches, for each plurality of modes supported, a selected mode of the plurality of modes more than at least one other mode of the plurality for providing a modal gain difference between the selected mode and the other mode for favoring excitation of the selected mode.

39. The method of claim 38 wherein the step of providing an active material includes providing an active semiconductor layer, and wherein the step of optically confining the laser includes providing additional layers stacked in the perpendicular direction with the active layer, the additional layers having an index of refraction different than the index of refraction of the active layer.

40. The method of claim 39 wherein the step of providing optical feedback includes providing at least one cleaved facet of a selected layer.

41. The method of claim 39 wherein the step of providing optical feedback includes providing Bragg reflectors for providing distributed feedback.

42. The method of claim 39 wherein the step of providing optical confinement includes providing a ridge waveguide structure.

43. The method of claim 42 wherein the step of providing a ridge waveguide structure includes providing a ridge waveguide structure having a selected width in the lateral direction and wherein the step of confining the optical gain to a region includes providing a doped region extending in the perpendicular direction and substantially centered in the lateral direction in relation to the ridge waveguide structure.

44. The method of claim 42 wherein the step of providing a ridge waveguide structure includes providing a ridge waveguide structure having a selected width in the lateral direction and wherein the step of confining the optical gain to a region includes providing a doped region extending in the perpendicular direction and having a selected width in the lateral direction, the selected width being less than the width of the ridge waveguide structure in the lateral direction.

45. The method of claim 39 wherein the step of confining the optical gain to a region includes providing a pair of notches, the pair of notches extending in the perpendicular direction toward said active layer and spaced in the lateral direction for confining carrier diffusion in the lateral direction.

46. The method of claim 39 wherein the step of optically confining includes providing a buried waveguide structure.

47. The method of claim 46 wherein the step of optically confining the gain to a region includes providing a doped region extending in the perpendicular direction and being centered in the lateral direction in relation to the buried waveguide structure.

48. The method of claim 46 wherein the step of providing a buried waveguide structure includes providing a buried waveguide structure having a selected width in the lateral direction, and wherein the step of optically confining the gain to a region includes providing a doped region extending in the perpendicular region having a width in the lateral direction that is less than the selected width of the buried waveguide structure.

49. The method of claim 39 wherein the step of providing additional layers includes providing first and second layers that are doped n-type and wherein the step of confining optical gain to region includes providing a region of said second layer doped p-type and including a Zn diffused doped region bounded in a layer including n-type material.

50. The method of claim 38 wherein the step of confining the optical gain to a region that overlaps, for each plurality of modes supported, a selected mode of the plurality of modes more than at least one other mode of the plurality for providing a modal gain difference between the selected mode and the other mode for favoring excitation of the selected mode includes overlapping and favoring a fundamental mode.

51. The method of claim 39 wherein the step of confining the optical gain to a region includes providing a region that is doped one of n-type and p-type in a layer that is doped the other of n-type and p-type.

52. The method of claim 39 wherein the step of confining the optical gain to a region includes providing a region that is doped p-type of a layer that includes a proton bombarded region.

53. The method of claim 39 wherein the step of confining the optical gain to a region includes providing a doped region between a pair of ridges of insulating material, the pair of ridges extending in the perpendicular direction spaced in the lateral direction.

54. The method of claim 38 wherein the step of confining the optical gain to a region includes confining the optical gain to a region that has a width, in the lateral direction, that is less than the width in the lateral direction to which said supported lateral modes extend.

55. The method of claim 39 wherein the step of providing additional layers includes providing first and second layers having, as a function of perpendicular distance from the active layer, an index of refraction that is lower than the index of refraction of said active layer within a first distance of said active layer and between said first distance and a second distance greater than the first distance the index of refraction of said layers is less than that of the active layer and greater than the index of refraction within first distance.

56. The method of claim 39 wherein the step of providing additional layers includes providing first and second layers having, as a function of perpendicular distance from said active layer, an index of refraction that decreases from the index of refraction of the active layer in a series of steps, each successive step having a lower index of refraction than the preceding step, and then increases for a subsequent step, the index of refraction of the subsequent step being lower than that of the active layer.

57. The method of claim 56 wherein the step of providing first and second layers includes providing first and second layers wherein the subsequent step has an index of refraction substantially equal to that of the first step in said series of steps.

58. The method of claim 39 wherein the step of confining the optical gain includes providing a doped region extending in the perpendicular direction and confined in the lateral direction for confining the lateral diffusion of carriers.

59. A method of providing a semiconductor laser having increased output power, comprising the steps of:
providing a semiconductor layer of active material;
providing index guiding layers stacked in the perpendicular direction with the active layer therebetween, the index guiding layers having indices of refraction selected for providing optical confinement in the lateral and perpendicular directions for supporting at least one of a plurality of lateral modes and a plurality of perpendicular modes;
providing optical feedback in the longitudinal direction, including one of cleaving facets of at least one of the layers and providing Bragg reflectors;
doping at least one layer one of n-type and p-type;
providing contacts for providing carriers for radiative recombination in the active region;
providing a gain confining region including a doped region of at least one of the layers, the doped region being doped the other of n-type and p-type, said doped region has a geometry which is substantially matched to an intensity profile of a selected one of said mode plurality, thereby providing a modal gain difference between the selected mode and the remainder of said mode plurality.

60. The method of claim 59 wherein the step of providing a doped region includes providing a doped region having a width in the lateral direction that is less than the lateral width to which the supported lateral modes extend.

61. The method of claim 59 wherein the step of providing index guiding layers for providing optical confinement in the lateral and perpendicular directions includes providing a ridge waveguide structure for providing optical confinement in the lateral direction.

62. The method of claim 61 wherein the step of providing a ridge waveguide structure includes providing a ridge waveguide structure having a selected width in the lateral direction and wherein the step of providing a doped region extending in the perpendicular regions includes providing a doped region disposed below the ridge waveguide structure in the perpendicular direction and having a width in the lateral direction that is less than the selected width in the lateral direction of the ridge waveguide structure.

63. The method of claim 61 wherein the step of providing a ridge waveguide structure includes providing a ridge waveguide structure having an insulating layer, and wherein the step of providing a doped region includes providing a doped region between a pair of notches of the insulating layer, the pair of notches extending downwardly in the perpendicular direction toward said active layer for confining carrier diffusion in the lateral direction.

64. The method of claim 59 wherein the step of providing index guiding layers for providing optical confinement in the lateral and perpendicular directions includes providing a buried waveguide structure for providing optical confinement in the lateral direction.

65. The method of claim 64 wherein the step of providing a doped region includes providing a doped region centered in the lateral direction in relation to the buried waveguide structure.

66. The method of claim 64 wherein providing a buried waveguide structure includes providing a buried waveguide structure having a selected width in the lateral direction and wherein the step of providing a doped region includes providing a doped region having a width in the lateral direction which is less than the width in the lateral direction of said buried waveguide structure.

67. The method of claim 59 wherein the step of providing a doped region includes providing a Zn doped region.

68. The method of claim 59 wherein the step of providing a doped region such that the confined gain region overlaps, for each plurality of modes supported, one mode of that plurality of modes more than at least one other mode of that plurality for providing a modal gain difference between the one mode and the other mode of that plurality for favoring excitation of the one mode of that plurality includes overlapping and favoring a fundamental mode.

69. The method of claim 59 wherein the favored mode is a fundamental mode.

70. The method of claim 59 wherein the step of providing a doped region includes a region that is doped p-type of a layer that includes a proton bombarded region.

71. The method of claim 59 wherein the step of providing a doped region includes providing a doped region between a pair of ridges of insulating material, the pair of ridges extending in the perpendicular direction.

72. The method of claim 59 wherein the step of providing index guiding layers includes providing layers having, as a function of perpendicular distance from the active layer, an index of refraction that is lower than the index of refraction of said active layer within a first distance of said active layer and between said first distance and a second distance greater than the first distance having an index of refraction that is greater than the index of refraction that is than that of the active layer and greater than the index of refraction within first distance.

73. The method of claim 59 wherein the step of providing index guiding layers includes providing layers having, as a function of perpendicular distance from said active layer, an index of refraction that decreases from the index of refraction of the active layer in a series of steps, each successive step having a lower index of refraction than the preceding step, and then increases for a subsequent step, the index of refraction of the subsequent step being lower than that of the active layer.

74. The method of claim 73 wherein the step of providing index guiding layers includes providing layers wherein the subsequent step has an index of refraction substantially equal to that of the first step in said series of steps.

\* \* \* \* \*